United States Patent [19]

Kreuzer

[11] 3,852,128

[45] Dec. 3, 1974

[54] METHOD OF DIFFUSING IMPURITIES INTO SEMICONDUCTOR WAFERS

[75] Inventor: Karl-Heinz Kreuzer, Heilbronn, Germany

[73] Assignee: Licentia, Patent-Verwaltungs-G.m.b.H., Frankfurt am Main, Germany

[22] Filed: Apr. 17, 1972

[21] Appl. No.: 244,961

Related U.S. Application Data

[63] Continuation of Ser. No. 12,011, Feb. 17, 1970, abandoned.

[30] Foreign Application Priority Data

Feb. 22, 1969 Germany.......................... 1909030

[52] U.S. Cl.................. 148/189, 148/186, 148/187, 117/201, 252/62.3 E, 252/62.3 GA

[51] Int. Cl. ............................................. H01l 7/44

[58] Field of Search .......... 148/189, 187, 186, 188; 252/62.3 E, 62.3 GA; 117/201

[56] References Cited

UNITED STATES PATENTS

| | | | |
|---|---|---|---|
| 2,868,678 | 1/1959 | Schockley | 148/189 |
| 3,362,858 | 1/1968 | Knopp | 148/189 X |
| 3,374,125 | 3/1968 | Goldsmith | 148/189 |
| 3,530,016 | 9/1970 | Joseph | 148/189 |
| 3,573,115 | 3/1971 | Topas | 148/189 |

*Primary Examiner*—G. T. Ozaki

*Attorney, Agent, or Firm*—Spencer & Kaye

[57] ABSTRACT

A method of diffusing impurities into semiconductor wafers comprises carrying out the diffusion in a diffusion chamber using doped semiconductor material in wafer form as a doping source. The concentration impurities at the surface of the wafers to be diffused may be controlled by the area ratio between the wafers to be diffused and the doping wafers and/or by the spatial arrangement of the wafers to be diffused and the doping wafers in the diffusion chamber.

10 Claims, 8 Drawing Figures

Inventor:
Karl-Heinz Kreuzer
BY Spencer & Kaye
ATTORNEYS.

Inventor:
Karl-Heinz Kreuzer
BY Spencer & Kaye
ATTORNEYS.

METHOD OF DIFFUSING IMPURITIES INTO SEMICONDUCTOR WAFERS

CROSS-REFERENCE TO RELATED APPLICATION

This application is a continuation of application Ser. No. 12,011, filed Feb. 17th, 1970, and now abandoned.

BACKGROUND OF THE INVENTION

The invention relates to a method of diffusing impurities into semiconductor wafers.

So-called vacuum diffusion has acquired increasing importance for the diffusion of impurities into semiconductor bodies in recent time. Said process is particularly suitable for the manufacture of individual planar components or integrated circuits, which are obtained in large numbers from semiconductor wafers containing numerous, similar structures.

In vacuum diffusion, a powder containing the impurity material often serves as source material for the impurities to be diffused into the semiconductor wafers. In order to obtain this impurity powder, doped semiconductor bodies are sawn into wafers. The wafers are etched and ground. Then the powder is screened, etched again and dried. Finally, the semiconductor wafers are upright in a wafer holder, are introduced, together with the doped semiconductor powder, into a quartz glass ampoule which is exhausted and sealed off. The diffusion process is initiated and carried out by heating the ampoule in a furnace. After the diffusion, the ampoule must be sawn up or otherwise destroyed.

The powder-diffusion process has some disadvantages. Thus the manufacturing process for the powder is complicated and expensive. The wafers to be diffused cannot be kept free of the powder dust when the wafer receiver is being filled with the powder, during the transport of the ampoule and during the exhausting process. In addition, it has been found that the losses caused by the cleaning necessary after each diffusion operation are very considerable with powder diffusion.

SUMMARY OF THE INVENTION

It is an object of the invention to provide a method of diffusing impurities into semiconductor wafers in which the above described disadvantages are reduced or obviated.

According to the invention, there is provided a method of diffusing impurities into semiconductor wafers comprising diffusing the semiconductor wafers in a diffusion chamber using doped semiconductor material in wafer form as a doping source.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Figure 1:
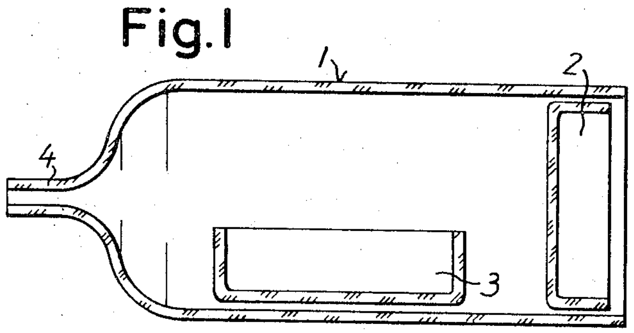
FIG. 1 shows a quartz ampoule which can be used for wafer diffusion in accordance with the invention.

Basically the method of the invention consists in that semiconductor wafers which are doped with the impurity material, are used as a doping source. The impurity concentration at the surface of the semiconductor wafer to be diffused is determined by the area ratio between the source wafers and the wafers to be diffused and/or by the spatial arrangement of the source wafers and of the wafers to be diffused in the diffusion chamber.

Wafer diffusion, wherein, in contrast to powder diffusion, doped semiconductor wafers are used instead of doped semiconductor powder as a source in the ampoule enables the layer resistance to be adjusted within a range from ±20 to ±30 percent by the selection of the area ratio between the source wafers and the wafers to be diffused. In wafer diffusion, whole wafers of a zone-drawn semiconductor crystal, for example of silicon, having a wafer thickness of from 500 to 700 $\mu$m, are used as a source. The manufacture of the impurity source material is much simpler for wafer diffusion than for powder. After being sawn, the semiconductor wafers serving as an impurity source are merely subjected to an etching process in which 20 $\mu$m for example is removed from the semiconductor surface. Furthermore, in wafer diffusion, it is impossible for the semiconductor wafers which are to be diffused to be contaminated with powder dust. The impurity source wafers can be used repeatedly if a specific thickness of layer is removed from the surface of a semiconductor source wafers after each diffusion process. As a result, the consumption of material in the form of doped semiconductor source wafers is relatively low because, apart from etching away a thin surface layer after each diffusion, no further losses occur.

During the treatment of the impurity source wafers after each diffusion process, the procedure is preferably such that a layer is removed from these source wafers, the thickness of which layer is greater than the depth of penetration of the impurities into the diffused semiconductor wafers. The source wafers can either be etched away or ground away after each diffusion. It has proved an advantage if the area of the source wafers is larger than the area of the wafers to be diffused. Thus the required results, which were reproducable, were obtained in experiments in which the area of the semiconductor source wafers were 1.3 to 5 times as great as the area of the wafers to be diffused.

The semiconductor source wafers and the wafers to be diffused are preferably placed vertically, side by side, in a wafer receiver. As is also the case in powder diffusion, the wafer receiver thus filled is introduced into a quartz glass ampoule which is exhausted and sealed off. The actual diffusion process is then carried out by heating the quartz glass ampoule to a predetermined temperature for a period of time which is likewise predetermined.

In the course of experiments, it has been found that a variation in the impurity concentration at the surface of the semiconductor wafers to be diffused can be achieved by means of the spatial arrangement between the semiconductor source wafers and the semiconductor wafers to be diffused, in the diffusion chamber.

Figure 2:
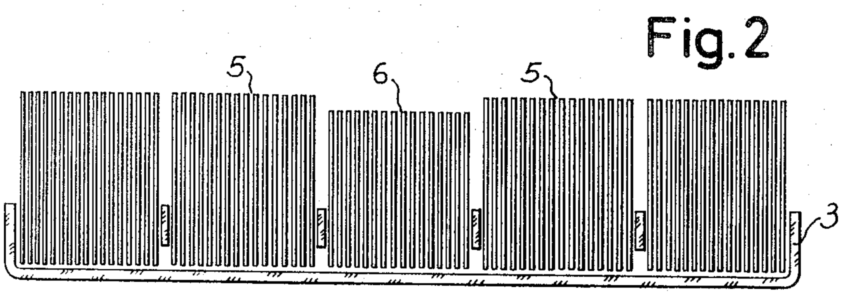
FIG. 2 shows a wafer holder showing the arrangement of the wafers therein.

Referring now to FIG. 1 of the drawings; a quartz glass ampoule 1 which consists of a tube, is illustrated in section. One end of the tube remains open, the other is provided with a small aperture 4 through which the interior of the tube is preferably scavenged with dry nitrogen before being exhausted. A fusible stopper 2, made of quartz, serves to close the ampoule and is sealed to the inner wall of the ampoule after the quartz glass ampoule provided with the semiconductor wafers has been exhausted, with an internal pressure of about $10^{-6}$ Torr. The wafer receiver 3 preferably likewise consists of quartz glass. The wafer receiver 3 provided with semiconductor wafers is likewise illustrated in section in FIG. 2. With the spatial arrangements illustrated in the Figure, the doped source wafers and the wafers to be diffused are combined in blocks in the wafer receiver. The silicon semiconductor wafers to be diffused are designated by the reference numeral 6 and are combined to form a block of 20 epitaxial wafers for example, substantially in the middle of the wafer receiver. Both on the left and on the right of this block consisting of semiconductor wafers to be diffused, two blocks 5 of doped source wafers are illustrated in each case, each block comprising about 10 to 15 semiconductor wafers. The semiconductor source wafers are about 500 to 700 $\mu$m thick.

Experiments have now been carried out wherein impurities are to be diffused into wafers. For example, the type of conductivity existing in the semiconductor body may have to have its doping reversed by the impurity material in the region of the surface layer. For this purpose, the silicon semiconductor wafers are covered, at the surface, with an oxide layer which is structured by means of the known photolacquer and etching process. The impurities diffusing out the source wafers during the diffusion can penetrate into the wafers to be diffused through the apertures thus formed in the oxide layer. Twenty epitaxial wafers for example were used during the experiments. 50 semiconductor source wafers of silicon, which were doped with boron for example at a concentration of $5.10^{18}$ atoms per $cm^3$ were needed for the diffusion. The diffusion time amounted to 1 hour; the diffusion temperature was maintained constant at about 1,200°C.

Hereinafter, the area of the boron-doped silicon source wafer is designated by $F_Q$, the area of the semiconductor wafer to be diffused is designated by $F_D$. The layer resistance $\rho_S$ designates the resistance of a square semiconductor layer having a specific depth of penetration and is given in ohms per square. $C_o$ designates the impurity surface concentration of the diffused semiconductor wafers. With the selected area ratios $F_Q$ to $F_D$ of 1.3, 2.0 and 4.0, the results given below were obtained.

| $F_Q/F_D$ | $\rho_S$ | $C_o$ |
|---|---|---|
| 1.3 | 360Ω▭ | $3.10^{18}$A/cm³ |
| 2.0 | 300Ω▭ | $4.10^{18}$A/cm³ |
| 4.0 | 250Ω▭ | $5.10^{18}$A/cm³ |

Figure 3:
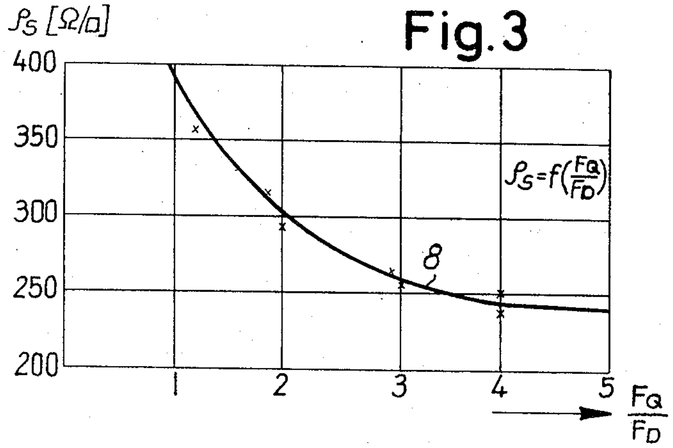
FIGS. 3 and 4 illustrate graphically the results obtained in test experiments.
Figure 4:
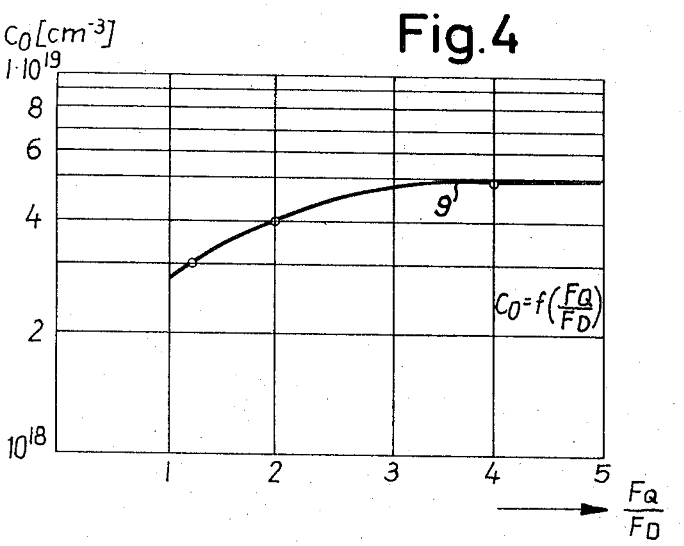

The functions $\rho_S = f\,(F_Q/F_D)$ and $C_o = f\,(F_Q/F_D)$ resulting from the above table are illustrated graphically in FIGS. 3 and 4, a logarithmic distribution to the base of 10 being selected for the value $C_o$.

As can be seen from the above table and the graphically illustrated functions 8 and 9 in FIGS. 3 and 4, the layer resistance drops as the area ratio $F_Q/F_D$ increases and with a constant diffusion time and diffusion temperature, while the surface concentration at the diffused semiconductor wafers increases as the area ratio $F_Q/F_D$ increases. In powder diffusion, the surface concentration which can be achieved is determined by the doping of the powder. For wafer diffusion, as FIG. 4 shows, invariable relationships only result when the surfaces of the source wafers are very large in comparison with the surface of the wafers to be diffused. Thus wafer diffusion permits the adjustment of the surface concentration by varying the area ratio $F_Q/F_D$, with a constant concentration in the impurity source wafers. As is apparent from FIG. 4, such adjustment is possible when diffusion is performed with the area ratio $F_Q/F_D$ lying in a region in which increases in the ratio $F_Q/F_D$ result in increases in the impurity surface concentration of the wafers being diffused and in which decreases in the ratio $F_Q/F_D$ result in decreases in the impurity surface concentration of the wafers being diffused. As is also apparent from FIG. 4, this region is in general at $F_Q/F_D$ less than 4.

In the experiments described, the thickness of the semiconductor surface layer, the doping of which was reversed during the diffusion, amounted to about 3$\mu$m. It is obvious that this depth of penetration increases as the period of diffusion rises. A layer of about 5 to 10 $\mu$m was etched away from the surface of the semiconductor source wafers after each diffusion had been effected. In this manner, the source, wafers can be used about 20 to 30 times. As a result, the consumption of material in the form of doped semiconductor wafers is relatively low.

Figure 5:
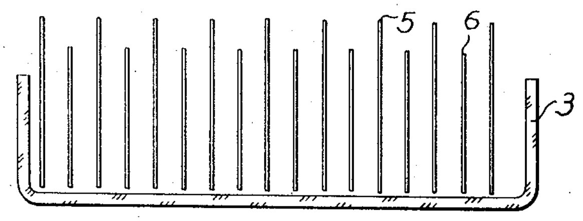
FIG. 5 shows the wafer holder shown in FIG. 2 but with a second arrangement of wafers therein.

In further experiments, the spatial arrangement of semiconductor source wafers and wafers to be diffused was varied in the wafer receiver. In FIG. 5, for example, an arrangement is illustrated wherein a source wafer 5 is disposed between each two semiconductor wafers 6 to be diffused, in the wafer receiver. All the wafers are separated from the adjacent wafers by a gap. The impurity concentration of the doping source again amounted to $5.10^{18}$ atoms per $cm^3$; boron was used as diffusion material; the diffusion period amounted to 1 hour and the diffusion temperature to 1,200°C. All these diffusion parameters were maintained during the subsequent experiments. The area ratio $F_Q/F_D$ was constant in all experiments, for example $F_Q/F_D = 2$.

With an arrangement such as is illustrated in FIG. 5, a surface concentration of $5.10^{18}$ atoms per $cm^3$ and a layer resistance of $\rho_S$ = 270 ohms/▭ are obtained in the diffused wafers under the above-mentioned conditions.

Figure 6:
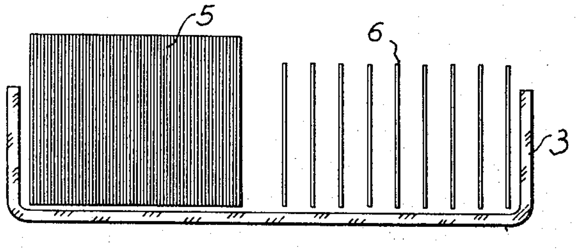
FIG. 6 shows the wafer holder shown in FIG. 2 but with a third arrangement of wafers therein.

In FIG. 6, a spatial arrangement of the semiconductor wafers is illustrated wherein the source wafers and the diffused wafers are combined in blocks in the wafer receiver. Between the semiconductor wafers 6 to be diffused, there is a space while the source wafers 5 touch one another. Under these conditions, a layer resistance of 320 Ohms per square and an impurity surface concentration of $C_o = 4.10^{18}$ atoms per $cm^3$ were obtained.

Figure 7:
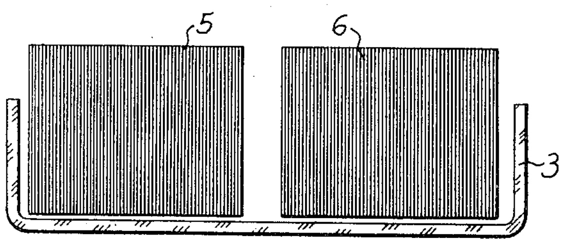
FIG. 7 shows the wafer holder shown in FIG. 2 but with a fourth arrangement of wafers therein.

The source wafers and the wafers to be diffused are likewise combined in blocks in the wafer receiver with an arrangement such as is illustrated in FIG. 7. In this case, both the source wafers 5 and also the semiconductor wafers 6 to be diffused touch one another. Under these conditions a layer resistance $\rho_S = 360$ Ohms per square is obtained with a surface concentration of $3.10^{18}$ atoms per $cm^3$.

Figure 8:
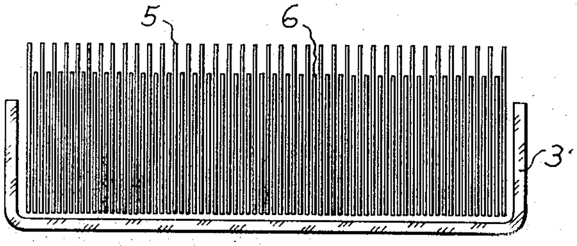
FIG. 8 shows the wafer holder shown in FIG. 2 but with a fifth arrangement of wafer therein.

A last possible arrangement is illustrated in FIG. 8. The semiconductor wafers to be diffused and source wafers alternate in the wafer receiver so that a source wafer is disposed between each two wafers to be diffused. In this case, provision is made for the source wafers 5 and the wafers 6 to be diffused to be in contact. With such an arrangement, a layer resistance of $\rho_S = 318$ Ohms per square and a surface concentration of $4.10^{18}$ atoms per $cm^3$ were found.

The experiments described above prove that the surface concentration which can be achieved in the diffused semiconductor wafers can also be varied by the position of the source and diffusion wafers in the wafer receiver, which in turn is accommodated in a quartz glass ampoule.

It is obvious that the diffusion process according to the invention is not restricted to specific semiconductor materials or impurity substances. In addition, the method indicated has been used for the manufacture of different semiconductor components. Thus in p-n-p transistors and n-p-n transistors for example, the base regions were produced under vacuum by accommodating source wafers having the appropriate doping and concentration together with the semiconductor wafers to be diffused in an evacuated ampoule. The reproducibility of the layer resistances and the uniformity in the diffusion profiles were good, likewise the reverse characteristics of the p-n junctions.

It will be understood that the above description of the present invention is susceptible to various modifications, changes and adaptations.

What is claimed is:

1. A method of diffusing impurities into a semiconductor wafer, comprising the steps of determining by diffusing in an exhausted and sealed off diffusion chamber with a doped semiconductor wafer means as doping source and under diffusion parameters otherwise fixed the impurity concentration achieved at the surface of a semiconductor wafer means to be diffused as a function of the ratio of the area of the doped semiconductor wafer means to the area of semiconductor wafer means to be diffused, selecting a desired impurity concentration for a given semiconductor wafer means to be diffused, and diffusing impurities into said given wafer means under the fixed diffusion parameters used in the step of determining and at the appropriate ratio determined in the step of determining.

2. A method as defined in claim 1, including removing from said semiconductor source wafer means after the diffusion operation a layer, the thickness of which is greater than the depth of penetration of the impurities into the diffused wafer means, and then reusing said semiconductor source wafer means for a further diffusion operation.

3. A method as defined in claim 1, including etching from said semiconductor source wafer means after a diffusion operation a layer, the thickness of which is greater than the depth of penetration of the impurities into the diffused wafer means, and then reusing said semiconductor source wafer means for a further diffusion operation.

4. A method as defined in claim 1, including grinding from said semiconductor source wafer means after a diffusion operation a layer, the thickness of which is greater than the depth of penetration of the impurities into the diffused wafer means, and then reusing said semiconductor source wafer means for a further diffusion operation.

5. A method as defined in claim 1, wherein in the step of diffusing at the appropriate ratio the area of said semiconductor source wafer means is selected larger than the area of said semiconductor wafer means to be diffused.

6. A method as defined in claim 1, wherein in the step of diffusing at the appropriate ratio the area of said semiconductor source wafer means is selected to be from 1.3 to 5 times as large as the area of semiconductor wafer means to be diffused.

7. A method as defined in claim 1, wherein said fixed diffusion parameters include vertical setting up of said semiconductor source wafer means and said semiconductor wafer means to be diffused side by side in a wafer receiver accommodated in a quartz glass ampoule as said chamber, with the quartz glass ampoule being evacuated and heated to a predetermined temperature for a period of time which is likewise predetermined.

8. A method as defined in claim 7, wherein said fixed parameters further include the evacuation of said ampoule to $10^{-6}$ Torr, said source means being in the form of 50 individual wafers of silicon doped with boron to a concentration of $5 \times 10^{18}$ atoms/$cm^3$, said means to be diffused being in the form of 20 silicon wafers placed in the middle of the 50 source wafers, a diffusion time of 1 hour at a temperature of 1,200°C, and the ratio of the area of source wafers to the area of wafers to be diffused lying between 1.3 and 5.

9. In a method for diffusing impurities into semiconductor wafers in an exhausted and sealed off diffusion chamber, in which method semiconductor wafers doped with the impurities are provided as doping source, the improvement comprising carrying out the diffusion with the ratio of the area of doped semiconductor wafer to the area of semiconductor wafer to be diffused, $F_Q/F_D$, lying in a region in which increases in the ratio $F_Q/F_D$ result in increases in the impurity surface concentration of the wafers being diffused and in which decreases in the ratio $F_Q/F_D$ result in decreases in the impurity surface concentration of the wafers being diffused.

10. In a method as claimed in claim 9, the further improvement that the ratio $F_Q/F_D$ is less than 4.

* * * * *